United States Patent [19]

Dozier

[11] 4,108,106
[45] Aug. 22, 1978

[54] CROSS-FLOW REACTOR

[75] Inventor: Alfred R. Dozier, Huntington Beach, Calif.

[73] Assignee: Tylan Corporation, Torrance, Calif.

[21] Appl. No.: 644,997

[22] Filed: Dec. 29, 1975

[51] Int. Cl.[2] ............................................. C23C 13/08
[52] U.S. Cl. ........................................ 118/49; 427/82; 427/255
[58] Field of Search ................ 118/48, 49, 49.1, 49.5; 427/294, 295, 296, 248 R, 248 A, 255, 82, 86, 94, 248 B, 248 C

[56] References Cited

U.S. PATENT DOCUMENTS

| | | | |
|---|---|---|---|
| 2,700,365 | 1/1955 | Pawlyk | 118/48 |
| 3,384,049 | 5/1968 | Capita | 118/49.5 |
| 3,461,836 | 8/1969 | Henker | 118/48 |
| 3,471,326 | 10/1969 | Kappelmeyer et al. | 118/48 X |
| 3,494,743 | 2/1970 | Baughman et al. | 118/49.1 X |
| 3,578,495 | 5/1971 | Pammer et al. | 118/48 |
| 3,637,434 | 1/1972 | Nakanuma | 118/48 |
| 3,660,179 | 5/1972 | Desmond et al. | 118/48 |
| 3,710,757 | 1/1973 | Porter | 118/48 |
| 4,018,183 | 4/1977 | Meuleman | 118/49 |

OTHER PUBLICATIONS

Emitter Diffusion System, IBM Technical Disclosure Bulletin, vol. 13, No. 6, Nov. 1970, R. Eshbach et al., p. 1459.

*Primary Examiner*—Mervin Stein
*Attorney, Agent, or Firm*—Nilsson, Robbins, Dalgarn, Berliner, Carson & Wurst

[57] ABSTRACT

A cross-flow reactor for single pass reaction of a plurality of semiconductor wafers with process gas at spaced locations within a heated reactor chamber. The process gas flows along a heated length of the chamber, counterflows to at least three spaced locations within the chamber, traverses the longitudinal axis of the chamber at the spaced locations and then exhausts from the chamber. In a particular embodiment, two or more different process gases are delivered as separate streams to the spaced locations for convergent cross-flowing thereat.

15 Claims, 14 Drawing Figures

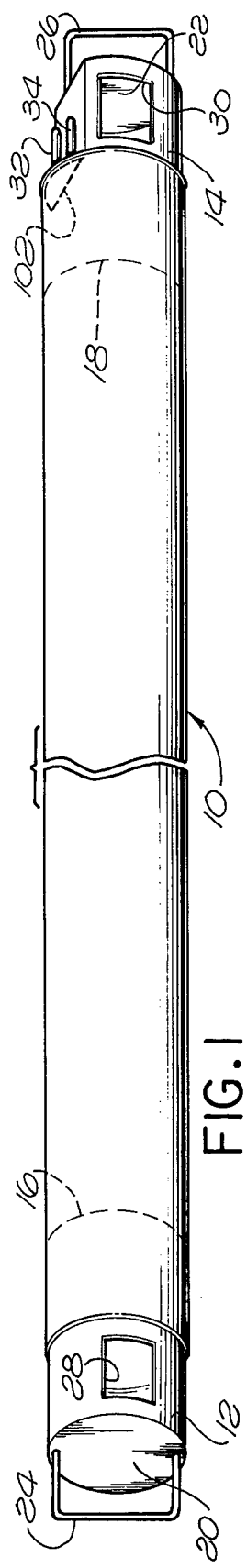
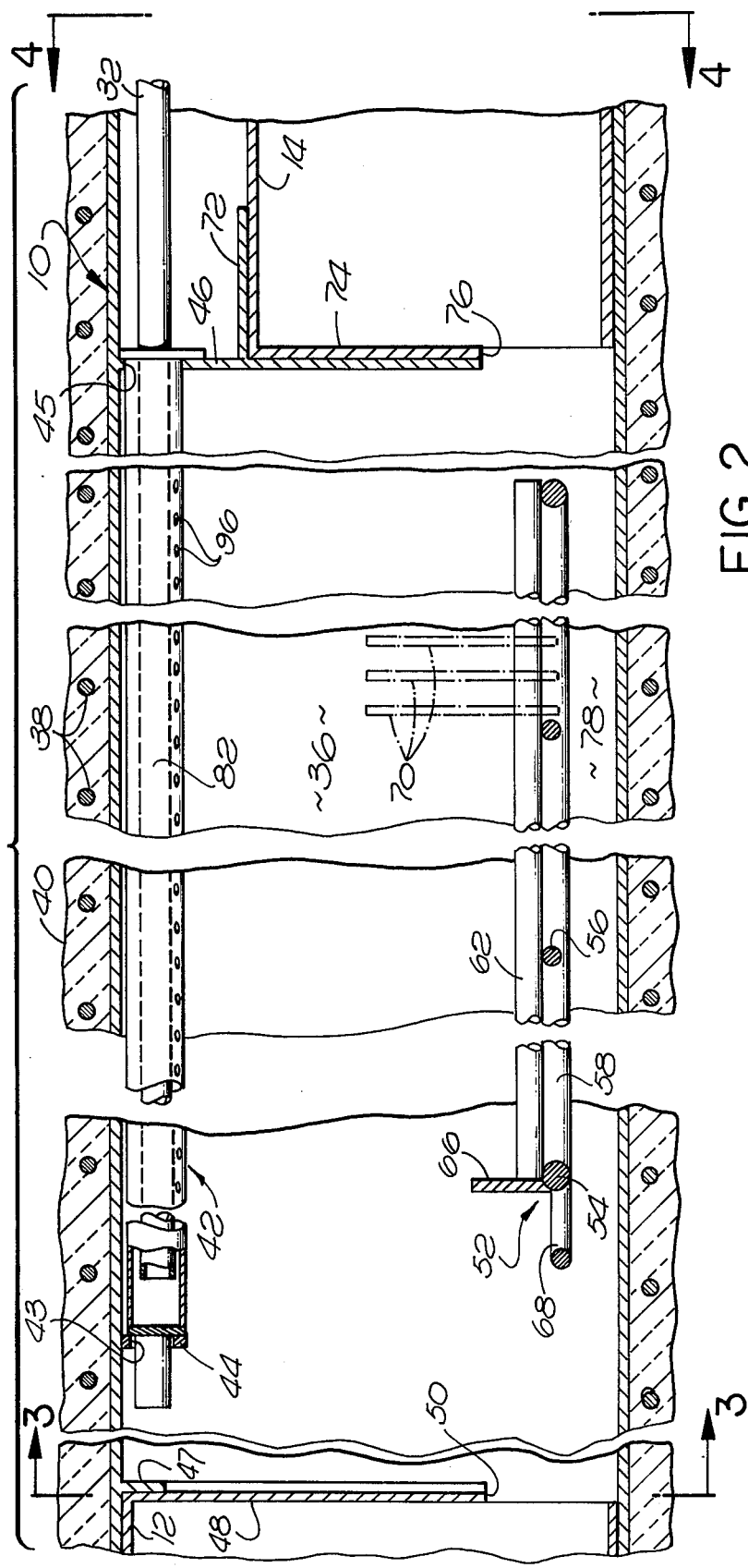

CROSS-FLOW REACTOR

FIELD OF THE INVENTION

The fields of art to which the invention pertains include the fields of semiconductor material processing and hot wall reactors.

BACKGROUND AND SUMMARY OF THE INVENTION

In the manufacture of semiconductor devices, many processes are carried out in a furnace commonly referred to as a diffusion furance, although such furnaces are not limited to diffusion operations. The furnace typically consists of an elongate round or rectangular tube having a length to diameter ratio in excess of 5 to minimize the effects of heat loss from the tube ends. An electrical heating element surrounds the tube and may be formed with independently-controlled zones to maintain a desired temperature profile in a chamber defined by the central portion of the tube. Such tubes often have a necked down end to accept one or more input tubes carrying gases and have their opposite ends open to a scavenger area for exhaust of the process gases.

In a typical process, a number of semiconductor wafers (e.g., thin slices of single-crystal silicon) are placed in a carrier, called a boat, either in a substantially vertical or substantially horizontal position, and the boat is then inserted into the central, chamber portion of the furnace. Process gases are introduced at one end, pass over the wafers, and exhaust out the other end. The desired reaction occurs when the gases are in contact with the wafers. In the case of deposition on the wafer surface, the gases are heated at the surface or in the immediate vicinity and react. The desired material is deposited while the other reaction products pass downstream over the other wafers to the exit. For example, to deposit a film of silicon nitride, separate gas streams of tetrachlorosilane and ammonia are introduced at one end of the tube and in passing over the wafers, the gases react to form silicon nitride and hydrogen chloride. The silicon nitride adheres to the wafer while the hydrogen chloride is exhausted. In the case of a diffusion process, one or more dopants are introduced in one or more gaseous streams for deposition on the wafers. The wafers are then held at an elevated temperature in a controlled atmosphere while the dopant diffuses into the wafer substrate.

In all deposition processes, a major concern is to achieve uniformity of the deposited material, both in thickness and composition, over the entire surface of each wafer, over all wafers in the furnace and over all successive batches of wafers. It can be appreciated that uniformity is a major problem in the processes described above because of variations in gas composition, temperature and gas velocity as the gases proceed from one end of the tube to the other. After the gases react on the first wafers, their compositions are locally altered so that succeeding wafers are treated with different gas compositions. In diffusion processes, semiconductor material is doped with a chemical element such as boron or phosphorous so as to produce certain desirable electrical porperties. The level of doping is commonly very small, in the range of a few parts per million. Since the process temperature is frequently near the softening point of the substrate, there is a tendency for the doping atoms to migrate out of the substrate into the gas stream, and vice versa. In a typical horizontal furnace, atoms which evaporate may be carried downstream and deposited on other wafers, causing variations in electrical properties. The foregoing problems can be somewhat alleviated by angling the wafer carrier, by canting the wafers in the carrier and/or by in other ways changing the flow geometry so that fresh, unreacted gas is constantly mixed into the stream.

In a second cause of nonuniformity, as the gases pass over the heated wafers and along the inside of the heated tube, they become progressively more heated and, therefore, their reaction rates will vary. Some compensation may be obtainable by adjusting the temperature profile of the furnace or by preheating the gases. Variations in gas velocity from one wafer to another is a third cause of uniformity, affecting the available chemical reaction time to each wafer.

For all of the foregoing reasons, the deposition process requires considerable technical skill to adjust it properly in the beginning, and excellent control of temperature, gas flow rate, gas composition and process time in order to achieve reproducable results.

The present invention provides apparatus and methods for accomplishing the deposition function with larger batch sizes of wafers or other units of semiconductor material than generally treated, yet with superior uniformity, without the necessity of excessive control of temperature, gas flow, gas composition and process time. The process may be characterized as a radial flow, or cross-flow, process in contrast to the normal methods described above which are axial flow processes.

In particular, apparatus and processes are provided for distributing gas to a plurality of at least three discrete space locations within a heated chamber for cross-flow of the gas so that it travels across the longitudinal axis of the chamber along a plurality of spaced paths for single pass traversal thereof. In a specific embodiment the gaseous reactants enter the furnace through a pair of distribution tubes that are closely adjacent to the upper surface of the tubular furnace wall. The distribution tubes are manifold tubes formed with small orifices which are aligned tube-to-tube so that gases from adjacent tubes converge as they flow from the tubes to thorourghly mix in a very small space.

The apparatus particularly enables the processing of a large number of wafers, each wafer having a substantially planar surface. The wafers are disposed so as to be vertically directed in a carrier of open construction with their planar surfaces preferably substantially vertically extending and substantially normal to the longitudinal axis of the reactor chamber which allows gases from the manifold tubes to flow essentially unimpeded parallel to the surface planes of the wafers. In the event that desposition is to occur on only one surface of each wafer, the wafers can be placed in back-to-back disposition. The carrier rests in the tubular furnace in such a manner as to form a plenum area under the wafers from which the spent or unused, cross-flowed gases are exhausted to one or both ends of the furnace. This arrangement allows each wafer to be treated with the same gas composition and flow conditions, while avoiding communication via the gas streams between the individual units, and thus significantly improves the uniformity of the process. In addition, many more wafers can be loaded in a batch since the gas does not pass successively over more than one wafer.

In a specific embodiment, the manifold tube is closed at one end. One or more imperforate conduit tubes are disposed within and extend along the manifold tube so that process gas can be delivered along a length of the heated chamber to a location adjacent the closed end of the manifold tube for counterflow in the manifold tube from the closed end to the orifices. By such means, the process gas flows from one end to the other of a heated section and then exits the orifices on the return flow. The result is a counterflow heat exhange to provide substantially uniform gas temperature at the manifold orifices from one end of the tube to the other end.

In alternative embodiments, the present invention provides other input arrangements including the use of a manifold tube from each end of the heated chamber, an input tube doubling back on itself with orifices located on the return portion, use of a single manifold tube, or a series of small manifold tubes, and use of one or more imperforate conduit tubes in parallelism or axially concentric within the manifold tube for conveyance and mixing of different gases in the manifold tube.

BRIEF DESCRIPTION OF THE DRAWINGS

FIG. 1 is a perspective view of a cross-flow reactor of the present invention;

FIG. 2 is a partially broken, length-wise cross-sectional view of the present reactor, and furnace wall associated therewith, illustrating internal components of the reactor;

DETAILED DESCRIPTION

Figure 3:
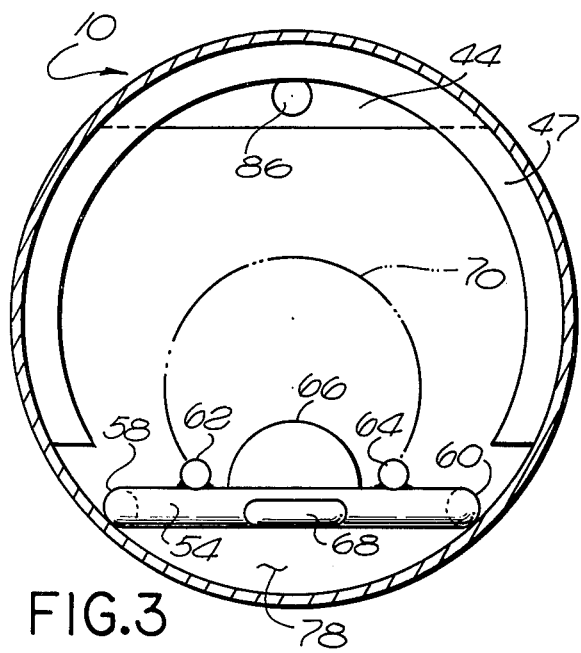
FIG. 3 is a cross-sectional view of the load end of the reactor, taken on the line 3—3 of FIG. 2.

As required, details of illustrative embodiments of the invention are disclosed. However, it is to be understood that these details merely exemplify the invention which may take forms different from the specific illustrative embodiments. Therefore, specific structural and functional details are not necessarily to be interpreted as limiting but simply as a basis for the claims. Additionally, while operation of the apparatus will be described with respect to the processing of semiconductor wafers, and specifically thin slices of single-crystal silicon, and a carrier designed therefor, the invention has broader application to any substrate material which is to be acted upon by a process gas at an elevated temperature and in which it is desired to provide uniformity of treatment without inordinate control of temperature, gas flow, gas composition and process time. Accordingly, reference to any specific process gas or gases and substrate material is only by way of illustration.

Referring initially to FIG. 1, there is illustrated the external appearance of a furnace constructed in accordance with the present invention and which is a cross-flow, hot wall reactor. The furnace includes an elongate tubular wall 10 fitted with a load end cap 12 at one end and an exhaust end cap 14 at the opposite end. In the specific embodiment illustrated, the tubular wall 10 has an internal diameter of 135 mm, external diameter of 140 mm and a length, excluding the end caps 12 and 14, of 1371.6 mm (4.5 feet). The end caps 12 and 14 each extend into the ends of the tubular wall 10 by a length of 457.2 mm (1.5 feet) as indicated by the dashed lines 16 and 18, respectively. The end caps 12 and 14 are formed with end walls 20 and 22, respectively, and with squared loops 24 and 26, respectively, formed of 10 mm diameter rod connected to the cap end walls 20 and 22 in extension therefrom to form finger holes for gripping of the caps 12 and 14. The end caps are also formed with square openings 28 and 30, respectively, which are formed to line up with vacuum exhaust ducts (not shown) which may be applied to the exhaust end cap 14 or to both end caps 12 and 14. A pair of injector tubes 32 and 34, as will be described in more detail hereinafter, just from the exhaust end of the tubular furnace wall 10 for connection with respective sources of process gas (not shown). The cap 14 is in truncated cylindrical form to permit the injector tubes 32 and 34 to extend from the exhaust end of the tubular furnace, whereas the load end cap 12 is cylindrical in form, snugly fitting within the load end of the tubular wall 10.

Referring to FIG. 2, further details of construction and internal components are illustrated. The tubular wall 10 is surrounded by heating elements 38 embedded within the walls of a cylindrically hollow refractory member 40 surrounding and defining a furnace chamber 36. A distribution tube assembly 42 extends along a heated length of the chamber 36 adjacent the inner top surface of the furnace wall 10, supported on opposite sides through openings 43 and 45 formed in bulkheads 44 and 46, respectively, at the load and exhaust ends, respectively, of the tubular wall 10. Referring additionally to FIG. 3, the bulkhead 44 is in the form of a circular segment bridging the top portion of the chamber 36. The tubular wall is also formed internally with a somewhat larger than semicircular flange 47, against which abuts the terminal end of the load end cap 12. As can be seen, the load end cap 12 is formed with a wall 48 which closes off the chamber 36 except for an opening 50 at the bottom thereof, which opening enables communication with the chamber through the load end cap window 28 (FIG. 1).

Also as seen in both FIGS. 2 and 3, an elongate carrier or boat assembly 52 is shown disposed along the bottom of the furnace chamber 36. The carrier includes a rectangularly shaped frame member 54 formed with several spaced rungs 56 spanning opposite legs 58 and 60 (FIG. 3) thereof. A pair of elongate rods 62 and 64 (FIG. 3) are connected at their front end by a semicircular guard wall 66 and extend rearwardly the length of the frame member 54. A finger hold 68 is formed by a semicircular length of rod connected to extend from the front of the frame member 54 for enabling one to grip the boat for inserting and removing the same from the furnace. As shown by the dashed lines 70 in FIGS. 2 and 3, a plurality of wafers of semiconductor material can be disposed in vertical position on the boat for simultaneous treatment of a large number of wafers.

Figure 4:
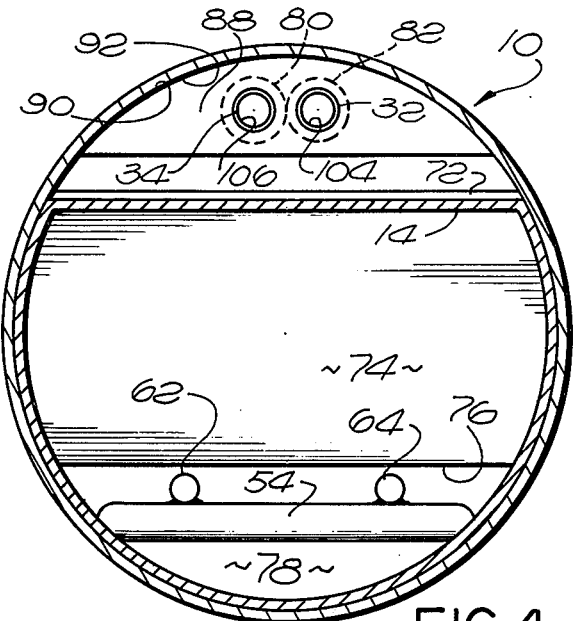
FIG. 4 is a cross-sectional view of the exhaust end of the reactor, taken on line 4—4 of FIG. 2.

Referring additionally to FIG. 4, the rear bulkhead 46 carries a horizontally diposed wall 72 extending outwardly normal therefrom and defines with the furnace wall 10 a truncated cylindrical region therebelow. The exhaust end cap 14 form-fits into the region in close engagement with the horizontal wall 72 and furnace wall 10, and has an end wall 74 which abuts the lower portion of the bulkhead 46. The bulkhead 46 extends to a point adjacent the bottom portion of the wall 10 aligned with an opening 76 formed in the bottom of the exhaust cap end wall 74.

As can be seen in FIGS. 2, 3 and 4, as a result of the openings 50 and 76 in the load and exhaust caps 12 and 14, respectively, and disposition of the rectangular carrier frame member 54 within the bottom of the tube 10, a plenum region 78 is defined below the carrier assembly 52 for exhaust of process gas. As above indicated, by application of vacuum ducts to both cap windows 28 and 30, exhaust can occur from both ends of the furnace tube 10. Alternatively, the load cap window 28 can be open to the atmosphere while the exhaust cap window is connected to a vacuum duct for exhaust through the exhaust cap 14, or vice versa.

Figure 5:
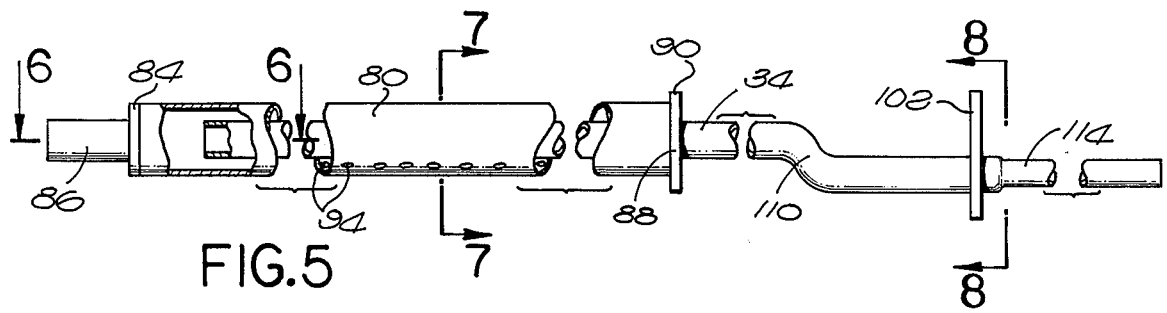
FIG. 5 is a partially broken, detail view of a distribution tube assembly in accordance with a particular embodiment of the present invention.
Figure 6:
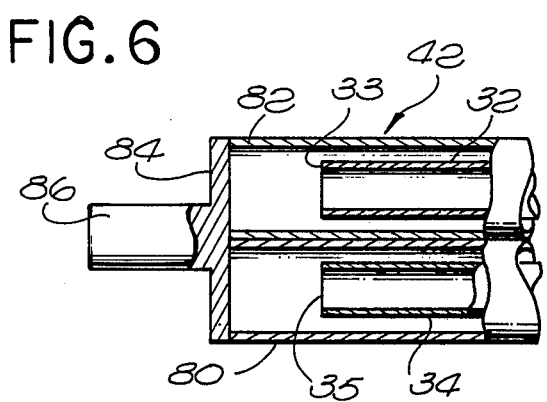
FIG. 6 is a cross-sectional view of one end of the distribution tube assembly taken on line 6—6 of FIG. 5.

Referring now to FIGS. 5-8, details are shown of construction of the distribution tube assembly 42. In this embodiment, the distribution tube assembly 42 is defined by a pair of closely adjacent manifold tubes 80 and 82 of which only tube 80 is shown in FIG. 5. The manifold tubes 80 and 82 extend substantially the length of the chamber 36 (FIG. 2) and are jointly provided with an end wall 84 of oblong shape sufficient to close that end of the manifold tubes 80 and 82, which ends can be referred to as the downstream end. The oblong end wall 84 is formed axially with a cylindrical member 86 extending outwardly therefrom and which serves to support the distribution tube assembly 42 at that end in the opening 43 formed therefor through the bulkhead 44 (FIG. 2). The upstream ends of the manifold tubes 80 and 82 are jointly closed by an end wall 88, also shown in FIG. 4, in the shape of a circular segment to snugly fit against the inner top portion of the furnace tube 10. The upstream end wall 88 closes the manifold tubes 80 and 82 at that end and permits the manifold tube assembly to be inserted through an oblong opening 45 therefor in the exhaust end bulkhead 46.

The manifold tubes are accurately located within the chamber by means of abutment of the inner surfaces of the end wall 88 with the outer surface of the bulkhead 46 and disposition of its arcuate top surface 90 in close fit relationship with the inner arcuate surface 92 of the top inner portion of the furnace tube 10.

Figure 7:
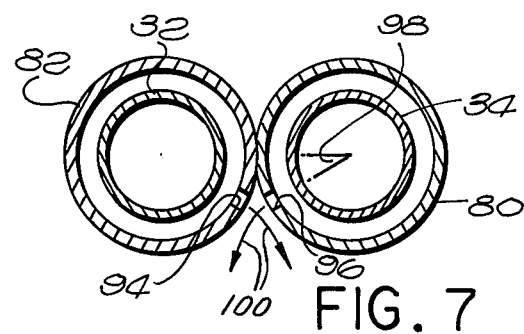
FIG. 7 is a cross-sectional view of the distribution tube assembly taken on line 7—7 of FIG. 5.

The manifold tubes 80 and 82 are formed with a plurality of spaced openings 94 and 96, respectively, some of which are shown in shadow in FIG. 5 and which are more clearly shown in FIG. 2. The openings 94 and 96 are spaced along the length of the manifold tube providing escapement ports for process gas applied to the manifold tube as hereinafter described. Referring additionally to FIG. 2, preferably the manifold tube openings 94 and 96 are disposed uniformly along the respective manifold tube 80 and 82 across the entire length of the region 36 which will be used for processing of the wafers 70. Referring specifically to FIG. 7, in the present embodiment, the manifold tubes are preferably in substantial parallelism. It is further preferred that respective series of openings 94 and 96 be aligned downwardly but at an acute angle 98 respective horizontal (as defined by the aligned manifold tubes 80 and 82) in confronting alignment one to the other. In this manner, process gases exiting from one manifold tube 80 impinge on process gas exiting from the adjacent manifold tube 82 so as to thoroughly mix in a very small space immediately therebelow as shown by the arrows 100.

Figure 8:
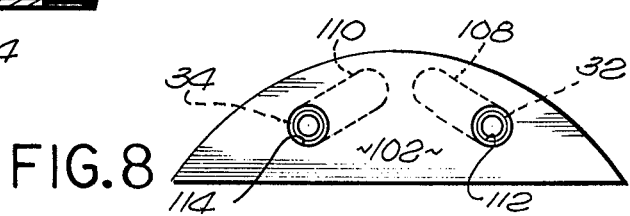
FIG. 8 is a view of a support wall securing injector tube portions of the distribution tube assembly, taken on line 8—8 of FIG. 5.

Process gases are delivered to the end wall 84 of the manifold tubes 80 and 82 by means of the injector tubes 32 and 34 referred to above with respect to FIG. 1. The injector tubes 32 and 34 are imperforate and extend from an upstream support wall 102 (FIGS. 5 and 8) formed as a circular segment close fit to the tube 10 and located adjacent the exhaust end of the tube 10 as indicated by the dashed line 102 in FIG. 1. The injector tubes 32 and 34 extend in substantial parallelism within their respective manifold tubes 82 and 80 to a position spaced from but adjacent the closing wall 84, and exit the manifold tubes 82 and 80 through openings 104 and 106 respectively in the upstream end wall 88 (FIG. 4). Outwardly of the end wall 88, the injector tubes 32 and 34 extend for a short distance in parallelism and then diverge at 108 and 110, respectively (FIGS. 5 and 8), continuing then in parallelism to the support wall 102 therefor extending through the support wall 102 through respective openings 112 and 114 therein (FIG. 8). Thereafter, the injector tubes 32 and 34 are continued with necked down portions as at 114 in FIG. 5.

The number of holes formed in the manifold tube will depend upon the number of wafers desired to be processed, the length of the manifold tubes, diameter of the furnace tube, etc. In the present embodiment, each manifold tube is formed with 29 holes equally spaced so that there are a total of 58 holes in the distribution tube assembly. By way of illustration of operation of the present apparatus, in a typical process, 28 wafers 70 are vertically placed in the carrier assembly 52, as shown in FIG. 2, each in a pair of notches (not shown) therefor through the top surfaces of the legs 58 and 60. The carrier assembly 52 is then inserted into the central chamber portion 36 of the furnace so that the wafers 70 are substantially aligned with the spaces between the manifold openings 94-96 and are disposed with their planar surfaces substantially normal to the longitudinal axis of the reactor chamber. The necked down portions of the injector tubes 32 and 34 are connected to flexible tubing (not shown) which in turn are connected to sources of process gas. The heating elements 38 are actuated so as to heat the interior of the furnace to a desired process temperature and a source of vacuum is applied to the opening 30 in the exhaust cap 14.

As an example, separate gas streams of tetrachlorosilane and ammonia can be introduced into the injector tubes 32 and 34, respectively, which serve as conduits for conveying the gas to the closed downstream ends of the manifold tubes 80 and 82, whereupon the process gas is counterflowed from there to the openings 94 and 96 for exit thereat. Upon exiting from the manifold 94 and 96, the process gas is mixed, as above indicated at 100, and cross-flowed therefrom so as to traverse the longitudinal axis of the chamber 36, passing over the wafers 70. The gases react to form silicon nitride and hydrogen chloride. The silicon nitride adheres to the wafer while the hydrogen chloride exhausts to the plenum area 78 via the opening 30 in the exhaust cap 14.

Figure 9:
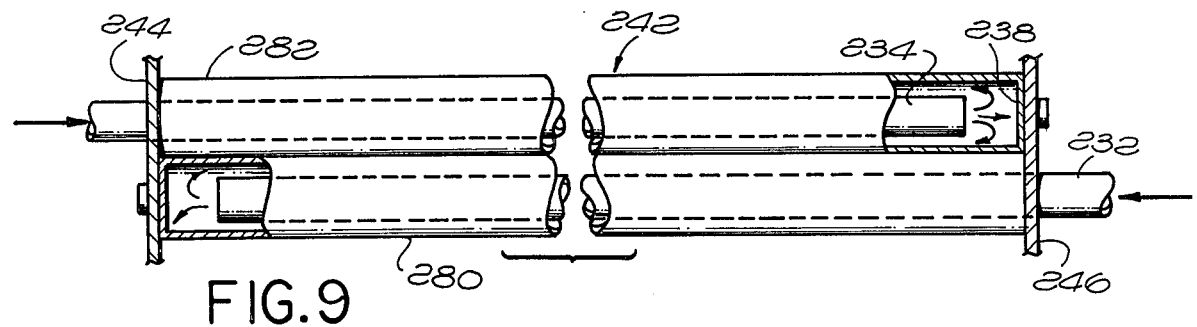
FIG. 9 is a partially broken, partially cross-sectional plan view of a first alternative distribution tube assembly.

Referring now to FIG. 9, an alternative distribution tube assembly 242 is illustrated carried between appropriate openings formed in load end and exhaust end bulkheads 244 and 246, respectively. The distribution tube assembly consists of a pair of closely spaced parallel extending manifold tubes 280 and 282 in which there are disposed imperforate injector tubes 234 and 232, respectively. The construction of the manifold tubes and injector tubes is in all respects identical to that referred to above with respect to FIGS. 5-7 except that the individual tubes are oppositely directed, that is, the injector tube 234 for the manifold tube 282 is inserted through the load end of the apparatus and extends spaced from but adjacent the terminal end of the manifold tube at the load end of the apparatus. On the other hand, the injector tube 232 is inserted at the exhaust end of the apparatus so as to extend within its manifold tube 280. Additionally, each manifold tube 280 and 282 is formed with its own end wall 281 and 283, respectively. By such means, process gas of one type can be introduced into one of the manifold tubes at one end of the heated chamber length and a second process gas can be introduced into the other manifold tube at the opposite end of the heated chamber.

Figure 10:
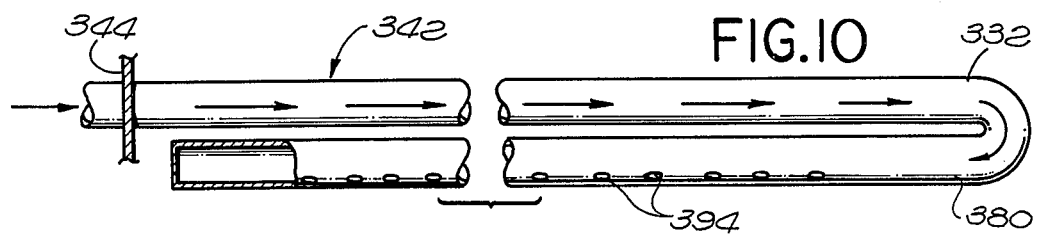
FIG. 10 is a partially broken, partially cross-sectional elevational view of a second alternative distributube assembly.

FIG. 10 illustrates an embodiment wherein the injector tube and manifold tube functions are combined in one length of tube. In a distribution tube assembly 342 shown in FIG. 10, one or more (one only is shown) distribution tubes can be formed with an elongate imperforate top portion 332 extending from an opening formed therefor in the load end bulkhead 344 along a heated chamber length and returning along the length as a tube member 380 formed with a plurality of openings 394.

Figure 11:
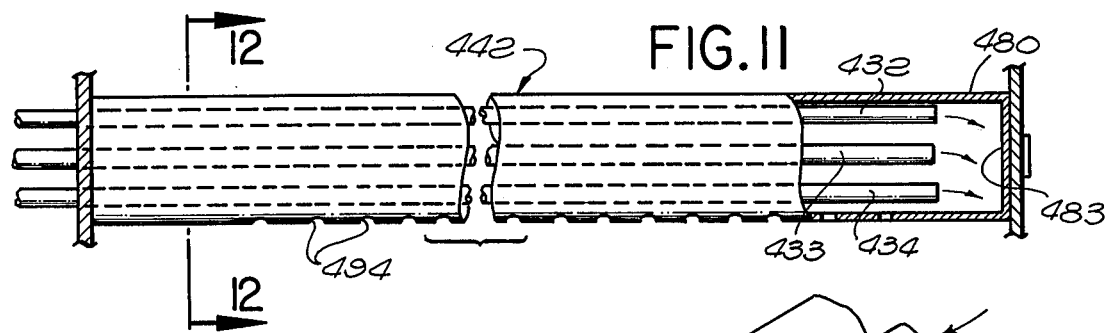
FIG. 11 is a partially broken, partially cross-sectional elevational view of a third alternative distribution tube assembly.
Figure 12:
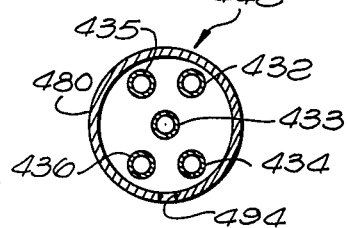
FIG. 12 is a cross-sectional view of the manifold tube and conduit tube portion of the assembly of FIG. 11, taken on the line 12—12.

FIGS. 11 and 12 illustrate a distribution tube assembly 442 in which a plurality of injector tubes, in this case five tubes 432-436, extend within a single manifold tube 480, each terminating at a point spaced from but adjacent a formed end 483 of the manifold tube 480 so that process gas supplied in separate streams to the injector tubes 432-436 impinge together upon each other to mix thereat and are then returned to exit the plurality of openings 494 at the bottom of the manifold tube. Since the mixing of the gases occurs within the manifold tube, the openings 494 need not be angled one against another unless a plurality of the manifold tubes are used, each with a plurality of the injector tubes. In the latter case, angling of the openings for convergence and mixing would be desirable. The arrangement depicted in FIGS. 11 and 12 can accomodate five different process gas streams, but of course any number of different gases up to five can be injected.

Figure 13:
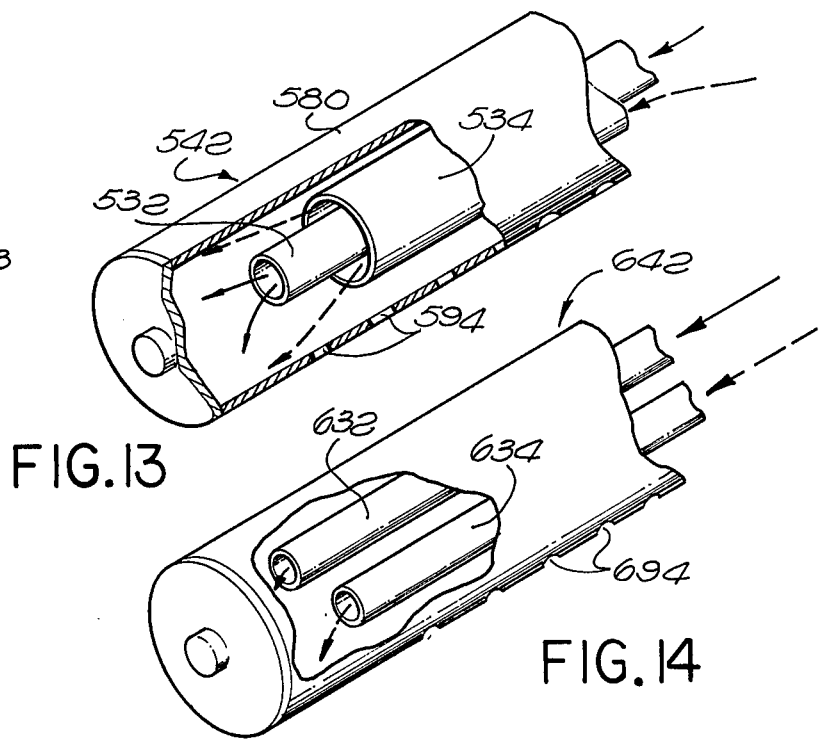
FIG. 13 is a partially cross-sectional, perspective view of the terminal portion of a fourth alternative distribution tube assembly.

FIG. 13 illustrates a further embodiment wherein a distribution tube assembly 542 is defined by a manifold tube 580, having downwardly directed openings 594, and along and within which extend a pair of injector tubes 532 and 534. One of the injector tubes 532 is of smaller diameter than the other injector tube 534 and is disposed coaxially with the larger injector tube 534.

Figure 14:
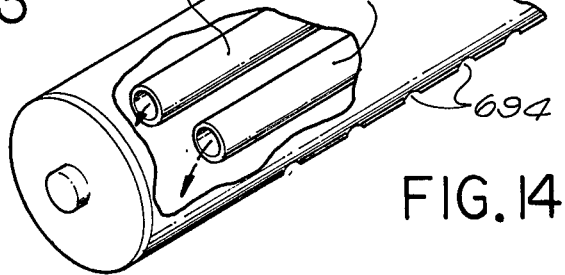
FIG. 14 is a partially cross-sectional, perspective view of the terminal portion of a fifth alternative distribution tube assembly.

In FIG. 14, there is illustrated a still further embodiment wherein the distribution tube assembly 642 is, as in FIG. 13, defined by a manifold tube 680 having downwardly directed openings 694 and along and within which extend a pair of injector tubes 632 and 634. In this embodiment, however, the injector tubes 632 and 634 are of substantially the same size and extend side-by-side in parallelism within the manifold tube 680.

The foregoing FIGS. 9-14 illustrate various alternative embodiments for the distributor tube assembly, and other variations in keeping with the scope of the appended claims can be made.

I claim:

1. A cross-flow reactor for processing of a plurality of at least three units of semiconductor material, each unit being formed of a wafer having a substantially planar surface, comprising:

means for defining an elongate chamber into which can be inserted said plurality of units of semiconductor material which are to be contacted with process gas;

carrier means for disposing said units with their planar surfaces vertically directed;

means for heating said chamber along a substantial length thereof to a desired temperature sufficient for desired reaction of said process gas with said semiconductor material;

means for distributing process gas to a plurality of at least three discrete locations within said chamber spaced from each other and spaced inwardly from the ends of said chamber length for travel of said gas across the longitudinal axis of said chamber as gas flows along a plurality of spaced paths for single pass traversal thereof; and means for exhausting said gas flows from said chamber after said single pass;

said distributing means comprising at least one elongate manifold tube, for receiving said process gas, disposed longitudinally within said chamber along said heated chamber length and formed with an opening at each said location for cross-flow therefrom of said process gas, said manifold tube being formed with a closed end downstream of said heated chamber length and wherein said distribution means includes at least one imperforate conduit tube within and extending along said manifold tube for delivering said process gas along said heated chamber length for counterflow of said process gas in said manifold tube from said closed end to said locations.

2. The reactor of claim 1 wherein said spaced locations are disposed along the top of said chamber and said exhaust means comprises means for drawing said cross-flowed gas along the bottom of said chamber.

3. The reactor of claim 1 wherein there are at least two of said manifold tubes coextensive along said heated chamber length.

4. The reactor of claim 3 wherein said manifold tubes are disposed in substantial parallelism.

5. A cross-flow reactor for processing of a plurality of at least three units of semiconductor material, each unit being formed of a wafer having a substantially planar surface, comprising:

means for defining an elongate chamber into which can be inserted said plurality of units of semiconductor material which are to be contacted with process gas;

carrier means for disposing said units with their planar surfaces vertically directed;

means for heating said chamber along a substantial length thereof to a desired temperature sufficient for desired reaction of said process gas with said semiconductor material;

means for distributing process gas to a plurality of at least three discrete locations within said chamber spaced from each other and spaced inwardly from the ends of said chamber length for travel of said gas across the longitudinal axis of said chamber as gas flows along a plurality of spaced paths for single pass traversal thereof, comprising at least two elongate manifold tubes, for receiving said process gas, disposed longitudinally coextensive within said chamber along said heated chamber length and each formed with an opening at each said location for cross-flow therefrom of said process gas, the respective openings of two of said coextensive tubes being in confronting alignment; and means for exhausting said gas flows from said chamber after said single pass.

6. The reactor of claim 5 wherein said openings are each at an acute angle from horizontal.

7. The reactor of claim 1 in which said chamber-defining means comprises an elongate tubular wall and said heating means comprises means for heating said wall.

8. A cross-flow reactor for processing of a plurality of at least three units of semiconductor material, each unit being formed of a wafer having a substantially planar surface, comprising:

means for defining an elongate chamber into which can be inserted said plurality of units of semiconductor material which are to be contacted with process gas;

carrier means for disposing said units with their planar surfaces vertically directed;

means for heating said chamber along a substantial length thereof to a desired temperature sufficient for desired reaction of said process gas with said semiconductor material;

means for distributing process gas to a plurality of at least three discrete locations within and disposed along the top of said chamber spaced from each other and spaced inwardly from the ends of said chamber length for travel of said gas across the longitudinal axis of said chamber as gas flows along a plurality of spaced paths for single pass traversal thereof; and means for drawing said cross-flowed gas along the bottom of said chamber to exhaust said gas flows from said chamber after said single pass;

said carrier means comprising an elongate carrier for said units of material disposed longitudinally within said chamber along the bottom thereof for disposing sai units in respective ones of said paths for single pass contact thereof with said gas, and defining a region of said chamber below said carrier as a plenum for exhaust process gas.

9. The reactor of claim 8 in which said carrier means is formed for disposition of said units of semiconductor material with their planar surfaces substantially vertically extending and substantially normal to the longitudinal axis of said reactor chamber.

10. A cross-flow reactor for processing of a plurality of at least three units of semiconductor material, each unit being formed of a wafer having a substantially planar surface, comprising:

means for defining an elongate chamber into which can be inserted said plurality of units of semiconductor material which are to be contacted with process gas;

carrier means for disposing said units with their planar surfaces vertically directed;

means for heating said chamber along a substantial length thereof to a desired temperature sufficient for desired reaction of said process gas with said semiconductor material;

means for distributing process gas to a plurality of at least three discrete locations within said chamber spaced from each other and spaced inwardly from the ends of said chamber length for travel of said gas across the longitudinal axis of said chamber as gas flows along a plurality of spaced paths for single pass traversal thereof; and means for exhausting said gas flows from said chamber after said single pass;

said distributing means comprising at least one elongate manifold tube, for receiving said process gas, disposed longitudinally within said chamber along said heated chamber length and formed with an opening at each said location for cross-flow therefrom of said process gas, said distribution means further comprising at least one elongate imperforate conduit tube disposed longitudinally within said chamber along said heated chamber length and returning along said length as said manifold tube.

11. A cross-flow reactor for processing of a plurality of at least three units of semiconductor material, each unit being formed of a wafer having a substantially planar surface, comprising:

means for defining an elongate chamber into which can be inserted said plurality of units of semiconductor material which are to be contacted with process gas;

carrier means for disposing said units with their planar surfaces vertically directed;

means for heating said chamber along a substantial length thereof to a desired temperature sufficient for desired reaction of said process gas with said semiconductor material;

means for distributing process gas to a plurality of at least three discrete locations within said chamber spaced from each other and spaced inwardly from the ends of said chamber length for travel of said gas across the longitudinal axis of said chamber as gas flows along a plurality of spaced paths for single pass traversal thereof; and means for exhausting said gas flows from said chamber after said single pass;

said distributing means comprising at least two elongate manifold tubes, for receiving said process gas, disposed longitudinally within said chamber coextensive along said heated chamber length and each formed with an opening at each said location for cross-flow therefrom of said process gas, said distribution means including means for introducing first process gas in one of said manifold tubes at one end of said heated chamber length and second process gas in a second of said manifold tubes at the opposite end of said heated chamber length.

12. A cross-flow reactor for processing of a plurality of at least three units of semiconductor material, each unit being formed of a wafer having a substantially planar surface, comprising:

means for defining an elongate chamber into which can be inserted said plurality of units of semiconductor material which are to be contacted with process gas;

carrier means for disposing said units with their planar sufaces vertically directed;

means for heating said chamber along a substantial length thereof to a desired temperature sufficient for desired reaction of said process gas with said semiconductor material;

means for distributing process gas to a plurality of at least three discrete locations within said chamber spaced from each other and spaced inwardly from the ends of said chamber length for travel of said gas across the longitudinal axis of said chamber as gas flows along a plurality of spaced paths for single pass traversal thereof; and means for exhausting said gas flows from said chamber after said single pass;

said distributing means comprising at least one elongate manifold tube, for receiving said process gas, disposed longitudinally within said chamber along said heated chamber length and formed with an opening at each said location for cross-flow therefrom of said process gas, said manifold tube being closed downstream of said heated chamber length and wherein said distribution means additionally comprises first and second imperforate conduit tubes within and extending along said manifold tube for delivering first and second process gases, respectively, along said heated chamber length for mixing of said process gases and counterflow of said mixed gases from said closed end to said locations.

13. A cross-flow, hot wall reactor, for processing of a plurality of at least three units of semiconductor material, each unit being formed of a wafer having a substantially planar surface, comprising:

an elongate tubular wall defining a chamber into which can be inserted carrier means for disposing said units of semiconductor material with their planar surfaces vertically directed;

means for heating said wall along a substantial length thereof;

at least one elongate manifold tube closed at one end and disposed longitudinally within said chamber adjacent the top inner surface of said wall and formed lengthwise with a plurality of at least three discrete openings spaced from each other and spaced inwardly from the opposite ends of said heated wall for cross-flow therefrom of said process gas so that said gas travels across the longitudinal axis of said chamber as gas flows along a plurality of spaced paths for single pass traversal thereof;

at least one imperforate conduit tube within and extending along said manifold tube for delivering said process gas along said heated length for counterflow of said process gas in said manifold tube from said closed end to said locations; and means for exhausting said gas flows from said chamber after said single pass.

14. The reactor of claim 13 in which said carrier means comprises an elongate carrier for said units of semiconductor material disposed longitudinally within said chamber adjacent the bottom side of said wall for disposing said units in respective ones of said paths for single pass contact thereof with said gas, and defining a region of said chamber below said carrier as a plenum for exhaust gas.

15. The reactor of claim 14 in which said carrier means is formed for disposition of said units with their planar surfaces substantially vertically extending and substantially normal to the longitudinal axis of said reactor chamber.

* * * * *